(12) United States Patent
Villella

(10) Patent No.: US 6,784,756 B2
(45) Date of Patent: Aug. 31, 2004

(54) ON-BOARD PROCESSOR COMPENSATED OVEN CONTROLLED CRYSTAL OSCILLATOR

(75) Inventor: David A. Villella, Chambersburg, PA (US)

(73) Assignee: Corning Incorporated, Corning, NY (US)

(*) Notice: Subject to any disclaimer, the term of this patent is extended or adjusted under 35 U.S.C. 154(b) by 29 days.

(21) Appl. No.: 10/376,166

(22) Filed: Feb. 28, 2003

(65) Prior Publication Data

US 2003/0197567 A1 Oct. 23, 2003

Related U.S. Application Data

(63) Continuation-in-part of application No. 10/037,962, filed on Dec. 21, 2001, now abandoned.

(51) Int. Cl.[7] ................................................. H03H 1/00
(52) U.S. Cl. ........................ 331/176; 331/69; 331/158
(58) Field of Search ................................ 331/66, 116 R, 331/158, 176, 69.65, 177.12, 175.74

(56) References Cited

U.S. PATENT DOCUMENTS

| | | |
|---|---|---|
| 3,719,838 A | 3/1973 | Peduto, et al. |
| 3,970,966 A | 7/1976 | Keller et al. |
| 4,259,606 A | 3/1981 | Vig |
| 4,317,985 A | 3/1982 | Wilson |
| 4,454,483 A | 6/1984 | Baylor |
| 4,586,006 A | 4/1986 | Emmons |
| 4,839,613 A | 6/1989 | Echols et al. |
| 4,845,337 A | 7/1989 | Goldberg et al. |
| 4,893,097 A | 1/1990 | Zwack |
| 4,899,117 A | 2/1990 | Vig |
| 4,949,055 A * | 8/1990 | Leitl .......................... 331/158 |
| 5,025,231 A | 6/1991 | Schwartzbach |
| 5,392,005 A | 2/1995 | Bortolini et al. |
| 5,530,408 A | 6/1996 | Vig et al. |
| 5,644,271 A | 7/1997 | Mollov et al. |
| 5,659,270 A | 8/1997 | Millen et al. |
| 5,659,884 A | 8/1997 | Daughtry, Jr. et al. |
| 5,668,506 A | 9/1997 | Watanabe et al. |
| 5,703,542 A | 12/1997 | Blandino |
| 5,719,782 A | 2/1998 | Mitsuoka |
| 5,729,181 A | 3/1998 | Cutler et al. |
| 5,781,073 A | 7/1998 | Mii |
| 5,917,272 A | 6/1999 | Clark et al. |
| 6,127,661 A * | 10/2000 | Fry ............................. 219/497 |
| 6,166,608 A | 12/2000 | Merriss et al. |
| 6,236,145 B1 | 5/2001 | Biernacki |
| 6,249,155 B1 | 6/2001 | Hartman et al. |
| 6,259,078 B1 | 7/2001 | Araya |

OTHER PUBLICATIONS

IEEE Transactions on Ultrasonics, Ferroelectrics, and Frequency Control, vol. 39 No. 3 May 1991—*Hysteresis in Quartz Resonators*—A Review.

(List continued on next page.)

Primary Examiner—Michael B Shingleton
(74) Attorney, Agent, or Firm—Timothy M. Schaeberle

(57) ABSTRACT

An oven controlled crystal oscillator has an onboard processor containing an algorithm used to generate a frequency compensating signal based on a predetermined relationship and a monitored current consumption of a heater.

38 Claims, 2 Drawing Sheets

OTHER PUBLICATIONS

1998 IEEE Transactions on Ultrasonics, Ferroelectrics, and Frequency Control 45:1476–1484—*The Modulational Method of Quartz Crystal Oscillator Frequency Stabilization.*

Factors Influencing Stability in the Microcomputer–Compensated Crystal Oscillator, Albert Benjaminson, Generel Technical Services, Inc. CH2818–3/90/0000–597 1990 IEEE.

The Microprocessor Compensated Crystal Oscillator–New Developments, Edward Jackson, Brian Rose, Q–Tech Corporation, 0–7803–5400–1/99/ 1999 IEEE.

The Microcomputer Compensated Crystal Oscillator (MCXO). M. Bioch, M. Meirs and J. Ho, Frequency Electronics, Inc. CH2690–6/89/0000–016 1989 IEEE.

Ultra–Stable OCXO Using Dual–Mode Crystal Oscillator, Y. Watanabe, K. Ozaki, S. Goka and H. Sekimoto, Tokyo Metropolitan University, Hachlojl, Tokyo; 0–7803–5838–4/00, 2000 IEEE.

A Low Cost Microcontroller Compensated Crystal Oxcillator, S. Deno, C. Hedhnlen, D. Landis, The Pennsylvania State University; 0–7803–3728–X/97–1997 IEEE.

A Low Cost High Stability Microcontroller Compensated Crystal Oscillator, N. Scott Deno, C. L. Hahnlen, David L. Landis, Pennsylvania State University, 0–7803–4373–5/98, 1998 IEEE.

\* cited by examiner

ON-BOARD PROCESSOR COMPENSATED OVEN CONTROLLED CRYSTAL OSCILLATOR

CROSS REFERENCE TO RELATED APPLICATION

This application is a Continuation-In-Part of U.S. Ser. No. 10/037,962, filed Dec. 21, 2001 now abandoned, entitled On-Board Processor compensated Oven Controlled Crystal Oscillator, of David Villella.

FIELD OF THE INVENTION

The present invention relates to crystal oscillators, and more particularly, to controlling an output frequency of an oven controlled crystal oscillator in response to a monitored temperature sensitive parameter and a calculated relationship between the monitored parameter and a frequency compensating signal.

BACKGROUND OF THE INVENTION

Oscillating circuits play a central and increasingly important role in digital and analog electronic systems. Digital devices require precise system timing, a function provided by oscillators and similar timing sources. Telecommunication and data transmission systems, which have analog and digital components, likewise rely on oscillators for modulation, demodulation, system clocking and other functions.

A standard choice for a highly stable frequency source in such applications is a crystal-based oscillator or resonator. Although atomic frequency standards are highly accurate, such devices are undesirable in most applications in view of cost and environmental capability.

While crystal oscillators are stable in comparison with non-crystal-based circuits, the crystal oscillators nevertheless exhibit a degree of variance in frequency and stability owing to the inherent frequency response to temperature changes and other environmental influences of crystals.

An approach to compensate for the temperature effects on a crystal resonator is to maintain a constant temperature of the temperature sensitive section of the oscillator. Such devices, oven controlled crystal oscillators (OCXO), provide enhanced stability and frequency control. However, OCXOs require increased manufacturing considerations and hence, greater costs so as to match the stabilities associated with their atomic frequency reference counterpart.

Double oven controlled crystal oscillators (DOCXO) provide the required stability needed for the higher stability applications. However, DOCXOs require increased material costs over the single oven.

The need exists for further controlling the frequency of an OCXO to provide enhanced stability over greater temperature ranges. In addition, the need exists for an economical method of controlling the frequency of a crystal oscillator without requiring a double oven construction.

SUMMARY OF THE INVENTION

The present invention provides an apparatus and method for the on-board adjustment of an output frequency of a crystal oscillator in conjunction with a heater and a frequency compensator, by monitoring a parameter corresponding to a power consumption of the heater and providing a frequency compensating signal to the input of the frequency compensator in response to the monitored parameter and a derived relationship between the monitored parameter and a required frequency compensating signal for the given crystal oscillator.

In a preferred configuration, the derived relationship is set forth in terms of the monitored parameter and a corresponding frequency compensating signal. This relationship can be a linear, non-linear or user defined relationship.

In one configuration, the monitored parameter corresponding to a power consumption of the heater is determined by the voltage measurement across a resister in series with the heater, where the varying voltage potential signifies a varying current consumption with a constant supply. However, it is understood a secondary relationship, or correspondence can be identified between the monitored parameter and the predetermined relationship.

Thus, one configuration an oven controlled crystal oscillator ("OCXO") includes an on-board processor and associated memory to retain the relationship and calculate a frequency compensating signal as a function of the monitored parameter and the retained relationship. The present invention thereby provides for the on-board frequency error correction due to temperature influence on a crystal in an oven controlled crystal oscillator.

DETAILED DESCRIPTION OF THE PREFERRED EMBODIMENTS

Figure 1:
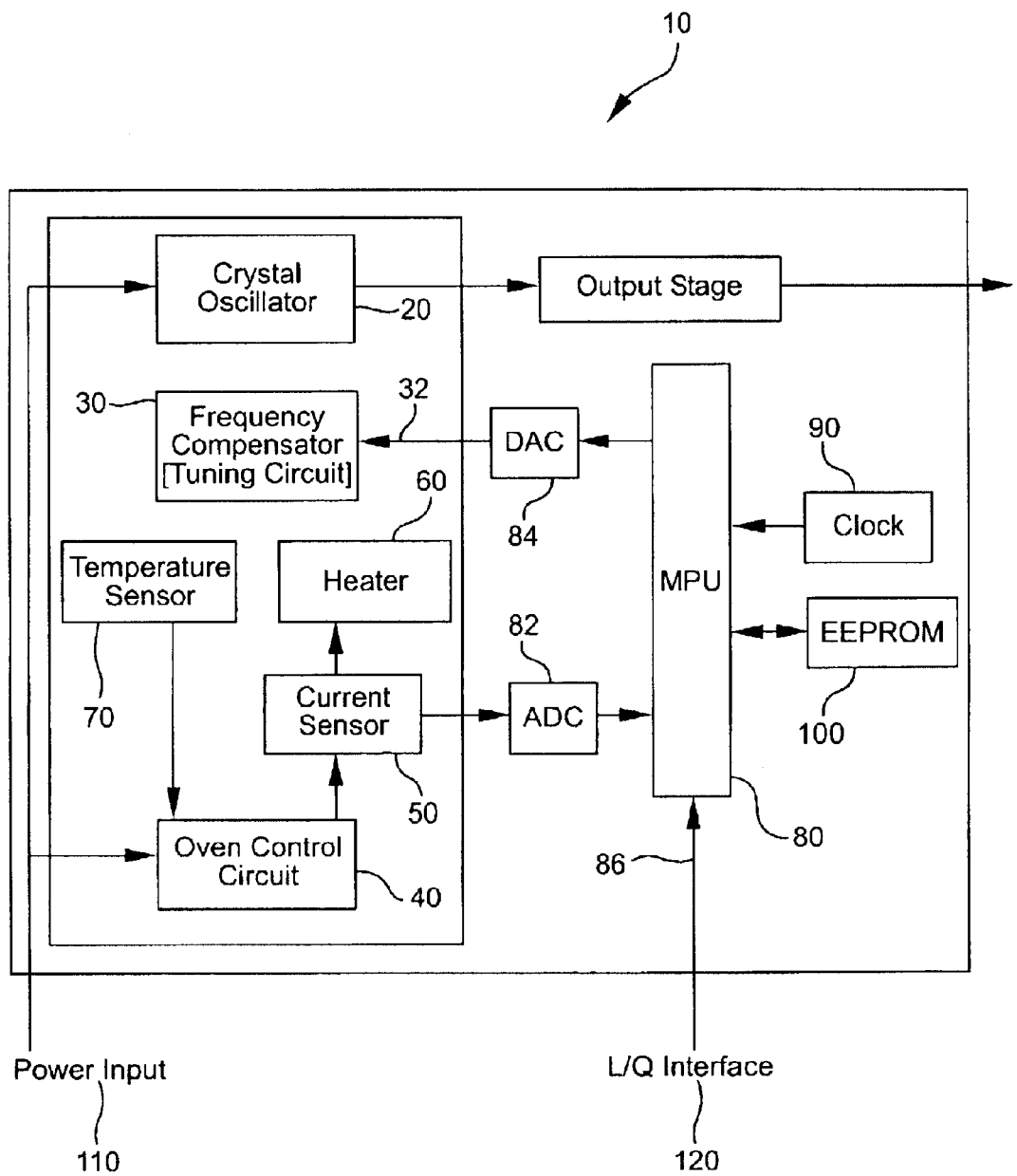
FIG. 1 is a block diagram of an oven controlled crystal oscillator having an on-board processor.
Figure 2:
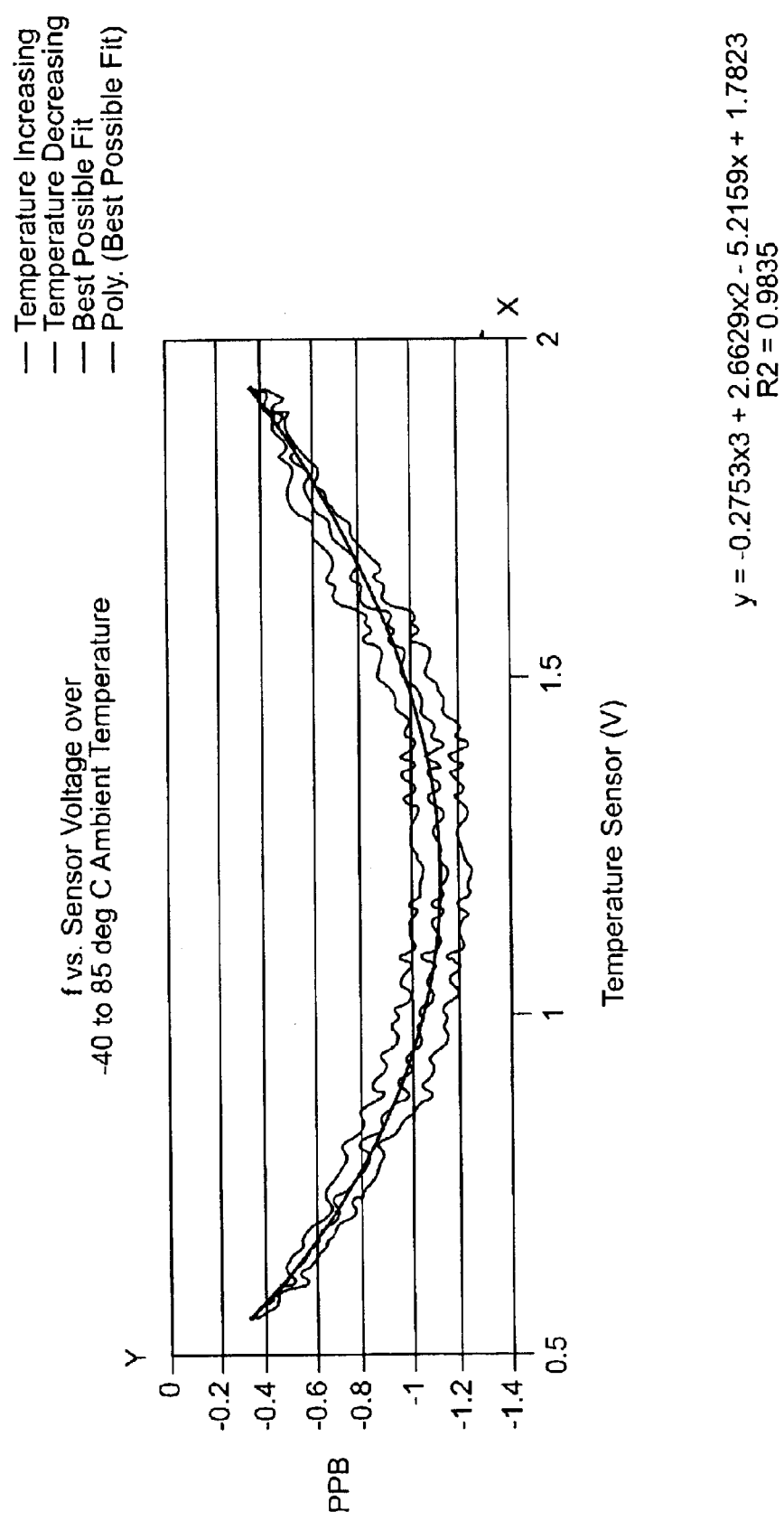
FIG. 2 is a graphical representation of crystal frequency versus temperature (in terms of a temperature sensor voltage).

Referring to FIG. 1, an oven controlled crystal oscillator ("OCXO") 10 is shown.

The OCXO 10 includes a crystal oscillator 20; a frequency compensator 30; an oven control circuit 40; a current sensor 50; a heater 60; a (temperature) sensor 70; a processor (microprocessor) 80; a reference clock 90 and a memory 100. In addition, the OCXO 10 includes a power input 110 for receiving power from an external or outside source.

All of the components of the OCXO 10 are enclosed within a substantially sealed environment by a package. The sealed package advantageously serves to isolate the OCXO 10 from adverse external temperature fluctuations. Preferably, the sealed package includes an input/output (I/O) interface 120 for allowing mode selection of the processor 80.

The crystal oscillator 20 may be any of a variety of commercially available oscillators including SC cut quartz crystals. However, it is understood that other cut crystals can be employed, without departing from the invention.

The frequency compensator 30 is operably connected to the crystal oscillator to adjust the frequency of the crystal oscillator 20 and includes a frequency compensating input 32.

The frequency compensator 30 can employ any of a variety of known systems including changing the load capacitance of the crystal oscillator 20 to change the frequency. Alternative frequency compensator schemes, include the frequency compensator 30, but is not limited to a varactor diode and a biasing scheme, which are used to vary the load capacitance of the crystal. Varying the load capacitance effectively changes the output frequency of the device. Other methods or biasing could be employed such as utilizing a potentiometer, digital potentiometer, digital-to-analog converter, integrators and adjustable regulators. Along with other means to adjust crystal loading including trim caps and capacitor banks in which capacitors could be switched in and out.

The thermal control of the crystal oscillator 20 in the OCXO 10 is performed by the oven control circuit 40, the heater 60 and the temperature sensor 70, as well as a thermal mass. The thermal mass can be an oven block made of a conductive material or simply be the can or package of the crystal.

The oven portion of the OCXO 10 is used to regulate the temperature of the temperature sensor 70, and hence crystal oscillator 20 to a set value. That is, as the ambient temperature changes around the OCXO 10, a heat flow occurs between the ambient environment and the OCXO 10. If the ambient temperature (surrounding OCXO 10), the temperature sensor 70 signals a change in temperature and the oven control circuit 40 increases or decreases the flow of a heating current to the heater 60 to bring the oven temperature back to the nominal temperature.

Because of inherent errors in the control of a temperature of crystal oscillator 20, a frequency deviates from a set nominal value. It is said then that the more accurately heater 60 can hold crystal oscillator 20 the more stable the control of a frequency.

The temperature sensor 70 is typically placed in close thermal proximity to the crystal 20. The temperature sensor 70 can be, but is not limited to, any of a variety of elements including thermistors, and digital and analog temperature sensors. The temperature sensor 70 is connected to the oven control circuit 40. The oven control circuit 40 is operably connected to the heater 60 to control an amount of current to the heater for generating resistive heating. However, it is understood the heater 60 can be any of a variety of heating devices, which can be controlled by the oven control circuit 40. In one configuration, the heater 60 can be a power transistor.

In the present invention, the current sensor 50 is operably connected to the heater 60 in the oven control circuit 40 for generating a signal corresponding to the amount of energy, power, or current flowing to the heater 60, when the supply voltage is held constant. However, alternative methods of obtaining a power signal maybe used for determining the amount of energy the heater 60 is consuming without departing from the scope of the invention.

In one configuration, the current sensor 50 is a high power thick film resister in series with the heater 60 to measure a voltage drop. The voltage drop is a measured voltage delta across the resistor to which a current can be determined by the equation I=deltaV/R and a power signal can then be determined with the equation P=V*I. However, it is understood different configurations of the current sensor 50 can be employed such as integrated current monitoring solutions and comparitors.

Typically, the monitored voltage from the current sensor 50 is amplified to broaden the voltage change over the available temperature range to achieve a sufficient resolution and thereby increase accuracy.

The processor 80 is operably connected to the current sensor 50. In one configuration, the current sensor 50 provides a signal, which is analog and is passed through an analog-to-digital converter (ADC) 82 for input to the processor 80. The output of the processor 80, such as the frequency compensating signal, passes through a digital-to-analog converter (DAC) 84 for communication to a frequency compensating input 32 of the frequency compensator 30. Also, available integrators include multipliers in conjunction with summers, which provide an analog processor solution.

The processor 80 is an on-board processor that is integrally retained and dedicated to the specific OCXO 10, and hence crystal oscillator 20. The memory 100 is connected to the processor 80. However, it is understood the processor 80 can include integrated memory. The memory 100 can be a non-volatile EEPROM for data storage.

The processor 80 includes, or is operably connected to the memory 100 for storing and retrieving data. Also, as well known in the art, a reference clock 90 is operably connected to the processor 80.

The processor 80 includes an interface 85 operably connected to the I/O interface 120 for toggling the processor between a read mode during the calibration process and an operating mode.

In one configuration the OCXO 10 employs a calibration run for each unit, or crystal oscillator 20. In the calibration run, the OCXO 10 is cycled through an entire specified temperature range. During the calibration process, the OCXO 10 is located in a temperature chamber and allowed to achieve thermal equilibrium. At this temperature, the oven control circuit 40 causes a power flow to the heater 60 to maintain the crystal oscillator at the desired temperature. At this temperature, the output frequency deviates from nominal. A required compensating signal is determined to accommodate for the deviation from nominal and the required amount of correction. Thus, data associating a given power consumption of the heater to a required compensating signal is obtained.

During the temperature cycle, current consumption measurements from the current sensor 50 are taken along with a corresponding voltage level (frequency compensating signal) required by the frequency compensator 30 to bring the crystal oscillator 20 frequency back to a nominal value. It is understood that any of a variety of parameters corresponding to the current consumption of the heater 60 can be measured. Further, the variable relating to the frequency of the crystal oscillator 20 can be any of a variety of parameters, including, but not limited to the crystal oscillator frequency, or the required frequency compensating signal, which in turn can be a required voltage for the frequency compensator 30.

Thus, during the calibration run, once a thermal equilibrium has been attained in the temperature chamber, the voltage corresponding to the current consumption of the heater 60 is taken. The frequency of the crystal oscillator 20 is measured. The frequency compensator 30 is adjusted to identify the required frequency compensating signal to bring the output frequency of the crystal oscillator 20 to the nominal value.

It is understood that during the calibration run, these data points, of current consumption versus required frequency compensating signal, can be taken periodically throughout the temperature slew. Further, the data points during the calibration run may be acquired during either or both the temperature up cycle and the temperature down cycle of the temperature slew. For an OCXO 10 having a calibration run that includes both the up cycle and the down cycle, the effect of thermal hysteresis can be addressed by determining a correspondence that splits the difference between the up cycle and the down cycle values. Alternatively, the processor 80 can be configured to employ a separate relationship for the up cycle and the down cycle, wherein during operation of the OCXO 10, the processor identifies the existing temperature slew as either an up cycle or down cycle and applies the appropriate relationship to calculate the required frequency compensating signal. In other words, the method contemplates utilizing the defining of two independent relationships corresponding to positive and negatively changing temperature slews.

During the read mode in the calibration process, the processor 80 and memory 100 acquire the corresponding current consumption measurements and required frequency compensating signals (voltages).

From the data acquired during the calibration run, the relationship between the measured current consumption of the heater 60 and the required frequency compensating signal (voltage) is calculated by any of a variety of mathematical algorithms such as the best fit method or least squares, and the relationship is determined. The coefficients generated by the curve-fitting algorithm are then stored in the memory 100 for subsequent use by the processor 80 during operation of the OCXO 10. However, predetermined or determined lookup tables can also be stored into memory to be use for correction.

That is, the calibration run provides a relationship between a parameter corresponding to the current consumption of the heater 60, and the necessary frequency compensating signal (corresponding to frequency deviation from nominal crystal oscillator frequency, and required voltage of the frequency compensator 30) over the intended operating temperature range.

In an alternative configuration, crystal oscillator frequency v. current sensor voltage measurements for a given crystal oscillator 20 can be accumulated to then calculate a crystal oscillator frequency v. current sensor voltage relationship, wherein the relationship can be calculated by fitting to a function, such as by using the least squares method. Thereby, the frequency deviation of the crystal oscillator 20 can be predicted using a given current sensor voltage and the derived frequency v. current sensor voltage algorithm. The processor 80 then calculates a frequency compensating signal corresponding to the calculated frequency deviation. That is, upon monitoring a given current consumption, the processor 80 performs the mathematical algorithm to determine a frequency deviation and then calculate the necessary frequency compensating signal.

During operation, the processor 80 monitors the current consumption of the heater 60, via the sensor 50 and performs the embedded calculation to generate a frequency-compensating signal. It is understood that the processor 80 can continually or periodically monitor the signal of the current sensor 50 and generate a corresponding "continuous" or periodic frequency compensating signal.

Thus, the present OCXO 10 provides on board monitoring and compensation of crystal oscillator frequency, without requiring external input during operation. That is, the OCXO 10 self compensates for frequency deviations caused by ambient temperature variations independent of external data input or reliance. As the processor 80 and determined relationship are carried with the OCXO 10, the present correction of frequency error due to temperature influences on the crystal is provided for "on board."

It has been found that the present processor compensated OCXO 10 can achieve double oven crystal oscillator temperature stability without double oven labor costs. Thus, the present OCXO 10 employs less components and less human intervention and fabrication as well as a decreased set up time.

While the invention has been described in connection with a presently preferred embodiment thereof, those skilled in the art will recognize that many modifications and changes may be made therein without departing from the true spirit and scope of the invention, which accordingly, is intended to be defined solely by the appended claims.

I claim:

1. A method for the onboard control of a crystal oscillator in an oven controlled crystal oscillator, comprising:
    (a) measuring a power consumption of a heater in the oven controlled crystal oscillator at a plurality of temperatures;
    (b) defining a relationship corresponding to the power-consumption of the heater and a required frequency compensating signal;
    (c) monitoring the power consumption of the heater during operation of the oven controlled crystal oscillator; and
    (d) generating a frequency compensating signal corresponding to the relationship and the monitored power consumption.

2. The method of claim 1, further comprising measuring the power consumption of the heater by measuring a voltage drop across a resistor in series with the heater.

3. The method of claim 1, further comprising defining the relationship in terms of the power consumption of the heater and the frequency compensating signal.

4. The method of claim 1, further comprising continuously monitoring the power consumption of the heater.

5. The method of claim 1, further comprising periodically monitoring the power consumption of the heater.

6. The method of claim 1, further comprising defining the relationship in accordance with a best fit curve fitting algorithm.

7. The method of claim 1, further comprising defining the relationship to minimize thermal hysteresis by splitting a difference between a positive temperature slew and a negative temperature slew.

8. The method of claim 1, further comprising defining the relationship through curve-fitting algorithms as a mathematical relationship.

9. The method of claim 1 wherein the relationship corresponding to the power consumption of the heater and a required frequency compensating signal, is a non-linear relationship.

10. The method of claim 1, further comprising storing the relationship within the oven controlled crystal oscillator.

11. A method for the onboard control of an output frequency of an oven controlled crystal oscillator, comprising:
    (a) monitoring a power consumption of a heater in the oven controlled crystal oscillator; and
    (b) creating a frequency compensating signal corresponding to the monitored power consumption and a derived relationship between the power consumption and required frequency compensating signal.

12. The method of claim 10, further comprising monitoring the current consumption of the heater by measuring a voltage drop across a resistor in series with the heater which corresponds to a power consumption through the relationship Power=V*I.

13. The method of claim 10, further comprising deriving the relationship in terms of the power consumption of the heater and the required frequency compensating signal.

14. The method of claim 10, further comprising continuously monitoring the power consumption of the heater.

15. The method of claim 10, further comprising periodically monitoring the power consumption of the heater.

16. The method of claim 10 wherein the relationship corresponding to the power consumption of the heater and a required frequency compensating signal, is a non-linear relationship.

17. A method for the onboard adjustment of an output frequency of an oven controlled crystal oscillator, comprising:
 (a) measuring a parameter corresponding to a power consumption of a heater in the oven controlled crystal oscillator with respect to a plurality of temperatures;
 (b) measuring parameters of at least a portion of the oven controlled crystal oscillator to provide a temperature to output frequency relationship of the oven controlled crystal oscillator;
 (c) creating a frequency compensating signal corresponding to a derived relationship between the measured parameter and the measured temperature to output frequency relationship; and
 (d) compensating the output frequency in response to the frequency compensating signal.

18. The method of claim 17, wherein measuring the parameter corresponding to the power consumption of a heater includes measuring a voltage drop across a resistor in series with the heater.

19. The method of claim 17, further comprising continuously creating a frequency compensating signal.

20. The method of claim 17, further comprising periodically creating a frequency compensating signal.

21. The method of claim 17 wherein the derived relationship between the measured parameter and the measured temperature to output frequency relationship, is a non-linear relationship.

22. A method for the onboard adjustment of an output frequency of a crystal oscillator having a heater and a frequency compensating input, comprising:
 (a) monitoring a parameter corresponding to a power consumption of the heater; and
 (b) providing a frequency compensating signal to the frequency compensating input in response to the monitored parameter and a derived relationship between the monitored parameter (or a corresponding parameter) and a required frequency compensating signal for the crystal oscillator.

23. The method of claim 22, further comprising continuously monitoring the parameter corresponding to the power consumption of the heater.

24. The method of claim 22, further comprising periodically monitoring the parameter corresponding to the power consumption of the heater.

25. The method of claim 24, further comprising monitoring voltage across a resistor in series with the heater.

26. The method of 22 wherein the derived relationship between the monitored parameter and a required frequency compensating signal for the crystal oscillator, is a non-linear relationship.

27. A method of controlling a crystal oscillator in an oven controlled crystal oscillator, comprising generating a frequency compensating signal corresponding to (i) a measured power signal, the measured power signal corresponding to a power consumption of a heater in the oven controlled crystal oscillator, and (ii) a predetermined relation between the measured power signal and a frequency compensating signal.

28. The method of claim 27, further comprising measuring a power consumption of the heater as the measured power signal.

29. The method of claim 27, further comprising measuring a voltage drop across a resistor in series with the heater as the measured power signal.

30. The method of claim 27, further comprising continuously generating a frequency compensating signal.

31. The method of claim 27, further comprising periodically generating a frequency compensating signal.

32. The method of claim 27, wherein the predetermined relation between the measured power signal and a frequency compensating signal, is a non-linear relationship.

33. A method of controlling a frequency of a crystal oscillator, comprising:
 (a) monitoring a current consumption of a heater thermally coupled to the crystal oscillator; and
 (b) generating a frequency compensating signal corresponding to a predetermined relationship between current consumption and a required frequency compensating signal.

34. The method of claim 33, further comprising monitoring the current consumption of the heater by measuring a voltage drop across a resistor in series with the heater.

35. The method of claim 33, further comprising continuously generating a frequency compensating signal.

36. The method of claim 33, further comprising periodically generating a frequency compensating signal.

37. The method of claim 33 wherein the predetermined relationship between current consumption and a required frequency compensating signal, is a non-linear relationship.

38. An oven controlled crystal oscillator assembly, comprising:
 (a) a crystal oscillator;
 (b) a heater thermally coupled to the oscillator;
 (c) a frequency compensator connected to the oscillator;
 (d) a sensor selected to provide a consumption signal corresponding to a power consumption of the heater; and
 (e) a processor connected to the sensor and the tuning circuit, the processor selected to provide a frequency compensating signal corresponding to the consumption signal and a predetermined relationship between a power consumption of the heater and a required frequency compensating signal.

* * * * *